US010079045B2

(12) United States Patent
Kang

(10) Patent No.: US 10,079,045 B2
(45) Date of Patent: Sep. 18, 2018

(54) SENSE AMPLIFIER, MEMORY APPARATUS AND SYSTEM INCLUDING THE SAME

(71) Applicant: SK hynix Inc., Icheon-si, Gyeonggi-do (KR)

(72) Inventor: Seok Joon Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/474,274

(22) Filed: Mar. 30, 2017

(65) Prior Publication Data
US 2018/0114552 A1 Apr. 26, 2018

(30) Foreign Application Priority Data
Oct. 26, 2016 (KR) ........................ 10-2016-0140321

(51) Int. Cl.
*G11C 7/02* (2006.01)
*G11C 7/06* (2006.01)
*G11C 7/22* (2006.01)
*G11C 7/12* (2006.01)
*G11C 7/10* (2006.01)

(52) U.S. Cl.
CPC ................ *G11C 7/065* (2013.01); *G11C 7/10* (2013.01); *G11C 7/12* (2013.01); *G11C 7/22* (2013.01)

(58) Field of Classification Search
CPC .. G11C 7/065; G11C 7/22; G11C 7/12; G11C 7/10
USPC ...................................... 365/205, 196, 210.1
See application file for complete search history.

(56) References Cited

U.S. PATENT DOCUMENTS

| 5,369,614 A * | 11/1994 | Miyanishi | G11C 7/005 |
| | | | 365/189.15 |
| 6,052,307 A * | 4/2000 | Huber | G11C 7/14 |
| | | | 327/52 |
| 7,315,475 B2 * | 1/2008 | Honda | G11C 11/5642 |
| | | | 365/185.2 |
| 7,349,276 B2 * | 3/2008 | Tonda | G11C 7/04 |
| | | | 365/185.2 |
| 7,545,694 B2 * | 6/2009 | Srinivasa Raghavan | ................. |
| | | | G11C 7/062 |
| | | | 365/189.15 |
| 7,920,436 B2 * | 4/2011 | Bedarida | G11C 7/062 |
| | | | 327/51 |
| 8,004,902 B2 * | 8/2011 | Amanai | G11C 16/28 |
| | | | 365/185.18 |
| 8,199,595 B2 * | 6/2012 | Bauser | G11C 7/065 |
| | | | 365/154 |
| 8,279,677 B1 * | 10/2012 | Raghavan | G11C 11/5642 |
| | | | 365/185.18 |
| 8,576,631 B2 * | 11/2013 | Daga | H03F 3/45179 |
| | | | 365/185.21 |

(Continued)

FOREIGN PATENT DOCUMENTS

KR 1020120063395 A 6/2012

*Primary Examiner* — Viet Q Nguyen
(74) *Attorney, Agent, or Firm* — William Park & Associates Ltd.

(57) ABSTRACT

A sense amplifier may be provided. The sense amplifier may include an amplification circuit and/or a cell current control circuit. The amplification circuit may be configured to compare a voltage level of a signal line with a level of a read voltage. The cell current control circuit may be configured to decrease the voltage level of the signal line based on an output signal.

20 Claims, 8 Drawing Sheets

(56) References Cited

U.S. PATENT DOCUMENTS

| | | | | |
|---|---|---|---|---|
| 8,644,056 B2* | 2/2014 | Oh | | G11C 11/1675 |
| | | | | 365/145 |
| 8,867,259 B2* | 10/2014 | Kawai | | G11C 13/0007 |
| | | | | 365/148 |
| 8,947,920 B2* | 2/2015 | Takahashi | | G11C 11/1673 |
| | | | | 365/148 |
| 8,947,924 B2 | 2/2015 | Li et al. | | |
| 9,019,746 B2* | 4/2015 | Yim | | G11C 13/004 |
| | | | | 365/148 |
| 9,202,561 B1* | 12/2015 | Park | | G11C 13/0038 |
| 9,208,872 B2* | 12/2015 | Shiimoto | | G11C 13/004 |
| 9,349,428 B2* | 5/2016 | Antonyan | | G11C 11/1673 |
| 9,543,017 B2* | 1/2017 | Bloom | | G11C 16/06 |
| 2003/0214861 A1* | 11/2003 | Takano | | G11C 7/1021 |
| | | | | 365/200 |
| 2006/0044902 A1* | 3/2006 | Shen | | G11C 7/067 |
| | | | | 365/205 |
| 2006/0221678 A1* | 10/2006 | Bedeschi | | G11C 11/5678 |
| | | | | 365/163 |
| 2006/0221734 A1* | 10/2006 | Bedeschi | | G11C 7/062 |
| | | | | 365/201 |
| 2007/0147128 A1* | 6/2007 | Edahiro | | G11C 7/12 |
| | | | | 365/185.21 |
| 2008/0042691 A1* | 2/2008 | Srinivasa Raghavan | | |
| | | | | G11C 7/062 |
| | | | | 327/52 |
| 2009/0273998 A1* | 11/2009 | Mu | | G11C 7/062 |
| | | | | 365/205 |
| 2013/0021838 A1* | 1/2013 | Tomotani | | G11C 13/0007 |
| | | | | 365/148 |
| 2013/0070512 A1* | 3/2013 | Yim | | G11C 5/147 |
| | | | | 365/148 |
| 2014/0133214 A1* | 5/2014 | Yim | | G11C 13/004 |
| | | | | 365/148 |
| 2014/0153318 A1* | 6/2014 | Perner | | G11C 7/02 |
| | | | | 365/148 |
| 2014/0254241 A1* | 9/2014 | Shiimoto | | G11C 13/004 |
| | | | | 365/148 |
| 2015/0243352 A1* | 8/2015 | Park | | G11C 11/5642 |
| | | | | 365/163 |
| 2016/0013793 A1* | 1/2016 | Park | | G11C 7/065 |
| | | | | 365/158 |
| 2016/0125939 A1* | 5/2016 | Park | | G11C 11/1673 |
| | | | | 365/148 |
| 2016/0372191 A1* | 12/2016 | Nakayama | | G11C 13/004 |

\* cited by examiner

SENSE AMPLIFIER, MEMORY APPARATUS AND SYSTEM INCLUDING THE SAME

CROSS-REFERENCES TO RELATED APPLICATION

The present application claims priority under 35 U.S.C. § 119(a) to Korean application number 10-2016-0140321, filed on Oct. 26, 2016 in the Korean Intellectual Property Office, which is incorporated herein by reference in its entirety as set forth in full.

BACKGROUND

1. Technical Field

Various embodiments may generally relate to a semiconductor technology, and more particularly, to a sense amplifier, memory apparatus and system including the same.

2. Related Art

An electronic device consists of a lot of electronic elements, and a computer system consists of lots of electronic elements comprising semiconductor apparatuses. The computer system consists of a memory apparatus. A dynamic random access memory (DRAM) is widely used as a general memory apparatus since the DRAM has advantages of fast data input/output speed and random access. However, the DRAM consists of a memory cell comprising a capacitor and thus is volatile since the DRAM loses stored data when power supply is cut off. A flash memory apparatus has been proposed in order to overcome the disadvantage of the DRAM. The flash memory apparatus consists of a memory cell comprising a floating gate and thus is nonvolatile since the flash memory apparatus maintains stored data even when power supply is cut off. However, the flash memory apparatus has extremely slower data input/output speeds than the DRAM and can hardly support the random access.

Recently, the next-generation memory apparatuses having fast operation speeds and non-volatility are being researched and developed, and examples of the next-generation memory apparatuses consist of a Phase-Change Random Access Memory (PCRAM), a Resistive Random Access Memory (RRAM), a Magnetic Random Access Memory (MRAM), and a Ferroelectric Random Access Memory (FRAM). The next-generation memory apparatuses have advantages consisting of fast operation speeds and non-volatility. Particularly, the PRAM consists of a memory cell consisting of chalcogenides and stores data by changing a resistance value of the memory cell.

SUMMARY

According to an embodiment, a sense amplifier may be provided. The sense amplifier may include an amplification circuit and/or a cell current control circuit. The amplification circuit may be configured to compare a voltage level of a signal line with a level of a read voltage. The cell current control circuit may be configured to decrease the voltage level of the signal line based on an output signal.

DETAILED DESCRIPTION

Hereinafter, a semiconductor apparatus according to various embodiments will be described below with reference to the accompanying drawings through examples of embodiments.

Figure 1:
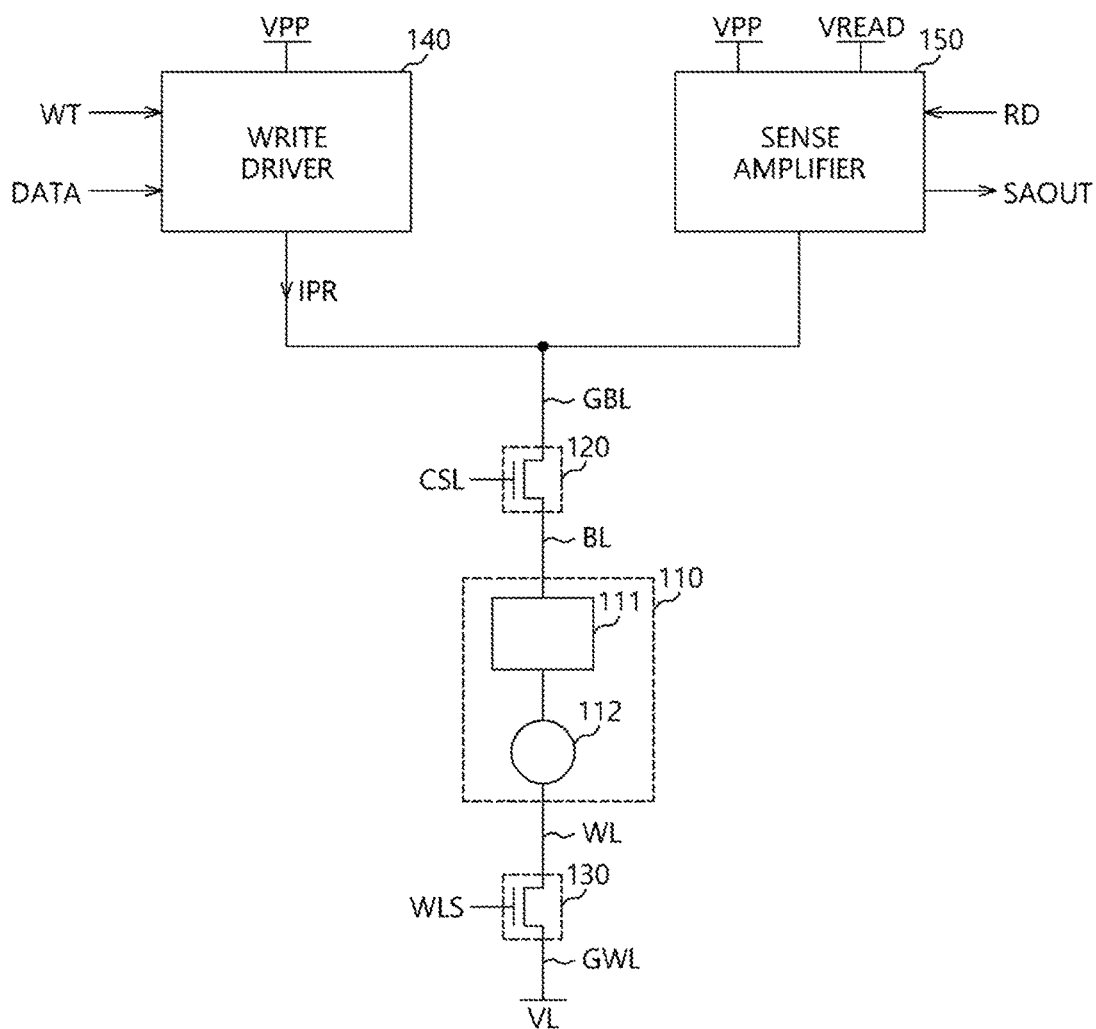
FIG. 1 is a diagram illustrating a non-volatile memory apparatus in accordance with an example of an embodiment of the present disclosure.
Figure 2:
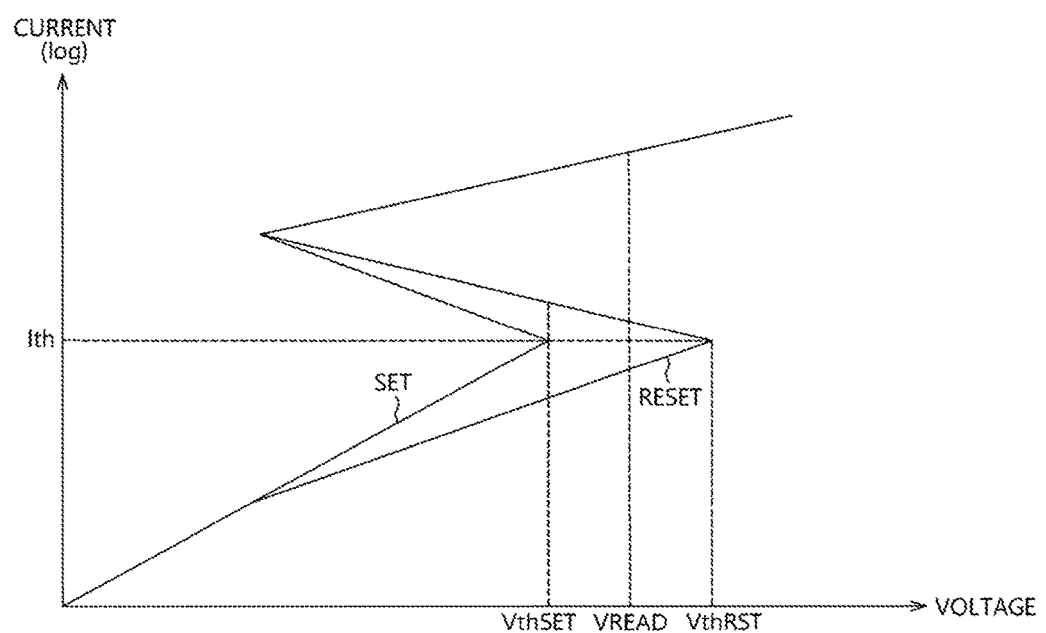
FIG. 2 is a current-voltage graph illustrating a characteristic of a switching element of FIG. 2.

FIG. 1 is a diagram illustrating a non-volatile memory apparatus 1 in accordance with an embodiment. Referring to FIG. 1, the non-volatile memory apparatus 1 may include a memory cell array 110. The memory cell array 110 may include a memory cell 111 and a switching element 112. The memory cell 111 may be composed of a variable resistive material and may store data. For example, the memory cell 111 may be programmed or/and written for storing data. The memory cell 111 may have a high resistance state or a low resistance state. The high resistance state may represent a reset data, and the low resistance state may represent a set data. The switching element 112 may allow a current to flow toward a predetermined direction such as a diode. The switching element 112 may be the Ovonic Threshold Switch (OTS). The Ovonic Threshold Switch may allow a great amount of current to flow through the Ovonic Threshold Switch when a current flowing through the Ovonic Threshold Switch is greater than a threshold current a voltage difference between both ends thereof is greater than a threshold voltage. FIG. 2 is a current-voltage graph illustrating a representation of an example of a characteristic of the switching element 112 of FIG. 2. Referring to FIG. 2, the horizontal axis of the graph represents a voltage difference between the both ends of the switching element 112, and the vertical axis of the graph represents a log-scaled amount of a current flowing through the switching element 112. The switching element 112 may stay turned off while a current flowing through the switching element 112 is less than a threshold current value Ith or a voltage difference between both ends of the switching element 112 is less than a threshold voltage value VthSET. An amount of current flowing through the memory cell 111 may be very small when the switching element 112 stays turned off. When the current flowing through the switching element 112 becomes greater than the threshold current value Ith or a voltage difference between both ends of the switching element 112 becomes greater than the threshold voltage value VthSET as the current flowing through the switching element 112 increases, the switching element 112 may be turned on. When the switching element 112 is turned on, an unlimited amount of current may flow through the memory cell 111.

The voltage difference between both ends of the switching element 112 may correspond to the threshold voltage value VthSET when the memory cell 111 has the low resistance state or stores a set data SET, and may be the threshold voltage value VthRST when the memory cell 111 has the high resistance state or stores a reset data RESET. As described later, a read voltage VREAD for reading data stored in the memory cell 111 may have a level between levels of the threshold voltage value VthSET and the threshold voltage value VthRST.

Referring to FIG. 1, the non-volatile memory apparatus 1 may include a column switch 120, a row switch 130, a write driver 140 and a sense amplifier 150. The memory cell array 110 may be coupled to a bit line BL at one end thereof, and coupled to a word line WL at the other end thereof. The non-volatile memory apparatus 1 may have hierarchical bit line structure and hierarchical word line structure. The column switch 120 may couple a global bit line GBL to the bit line BL based on a column selection signal CSL. Although not illustrated, the non-volatile memory apparatus 1 may further include a plurality of cell arrays and a plurality of column switches. Each of the plurality of cell arrays and each of the plurality of column switches may be coupled to different bit lines based on a corresponding column selection signal. The column selection signal CSL may represent a particular bit line according to a column address signal. Therefore, the global bit line GBL may be selectively coupled to the plurality of bit lines.

The row switch 130 may couple a global word line GWL to a word line WL based on a word line selection signal WLS. The word line selection signal WLS may be enabled on the basis of a row address signal. When the word line selection signal WLS is enabled, the row switch 130 may couple the word line WL, which is coupled to the other end of the memory cell array 110, to the global word line GWL. Although not illustrated, the non-volatile memory apparatus 1 may further include a plurality of row switches, which are commonly coupled to the global word line GWL. When a particular word line selection signal WLS is enabled, the global word line GWL may be selectively coupled to a cell array, which is coupled to a particular word line. The global word line GWL may be coupled to a node of low voltage VL. The node of low voltage VL may be coupled to a ground voltage and/or a bulk bias voltage. The bulk bias voltage may have a negative level lower than a level of the ground voltage. For example, the node of low voltage VL may be coupled to the ground voltage during a standby mode of the non-volatile memory apparatus 1, and may be coupled to the bulk bias voltage during an active operation of the non-volatile memory apparatus 1, which will not limit the scope of the present disclosure.

The write driver 140 may store data into the memory cell 111 by changing the resistance value of the memory cell 111. The write driver 140 may generate a program current IPR based on a write signal WT and data DATA. The write signal WT may be generated on the basis of a write command that the non-volatile memory apparatus 1 receives from an external apparatus. The data DATA may include a set data and a reset data. The program current IPR may include a set program current and a reset program current. The write driver 140 may generate the program current IPR from a power supply voltage VPP. Based on the data DATA, the write driver 140 may generate a set program current for programming the set data into the memory cell 111 and may generate a reset program current form programming the reset data into the memory cell 111. Amplitude of the reset program current may be greater than that of the set program current. The write driver 140 may change the resistance state of the memory cell 111 by providing the program current IPR to the memory cell array 110 through the global bit line GBL.

The sense amplifier 150 may generate an output signal SAOUT by reading stored in the memory cell 111. The sense amplifier 150 may read data stored in the memory cell 111 based on a read signal RD. The read signal RD may be generated on the basis of a read command that the non-volatile memory apparatus 1 receives from an external apparatus. The sense amplifier 150 may provide a current and/or a voltage to the memory cell array 110 through the global bit line GBL based on the read signal RD and the power supply voltage VPP. The sense amplifier 150 may generate the output signal SAOUT by comparing the read voltage VREAD with a voltage level according to data stored in the memory cell 111 and/or the resistance state of the memory cell 111. Referring to FIG. 2, the read voltage VREAD may have a level between levels of the threshold voltage value VthSET and the threshold voltage value VthRST.

Figure 3:
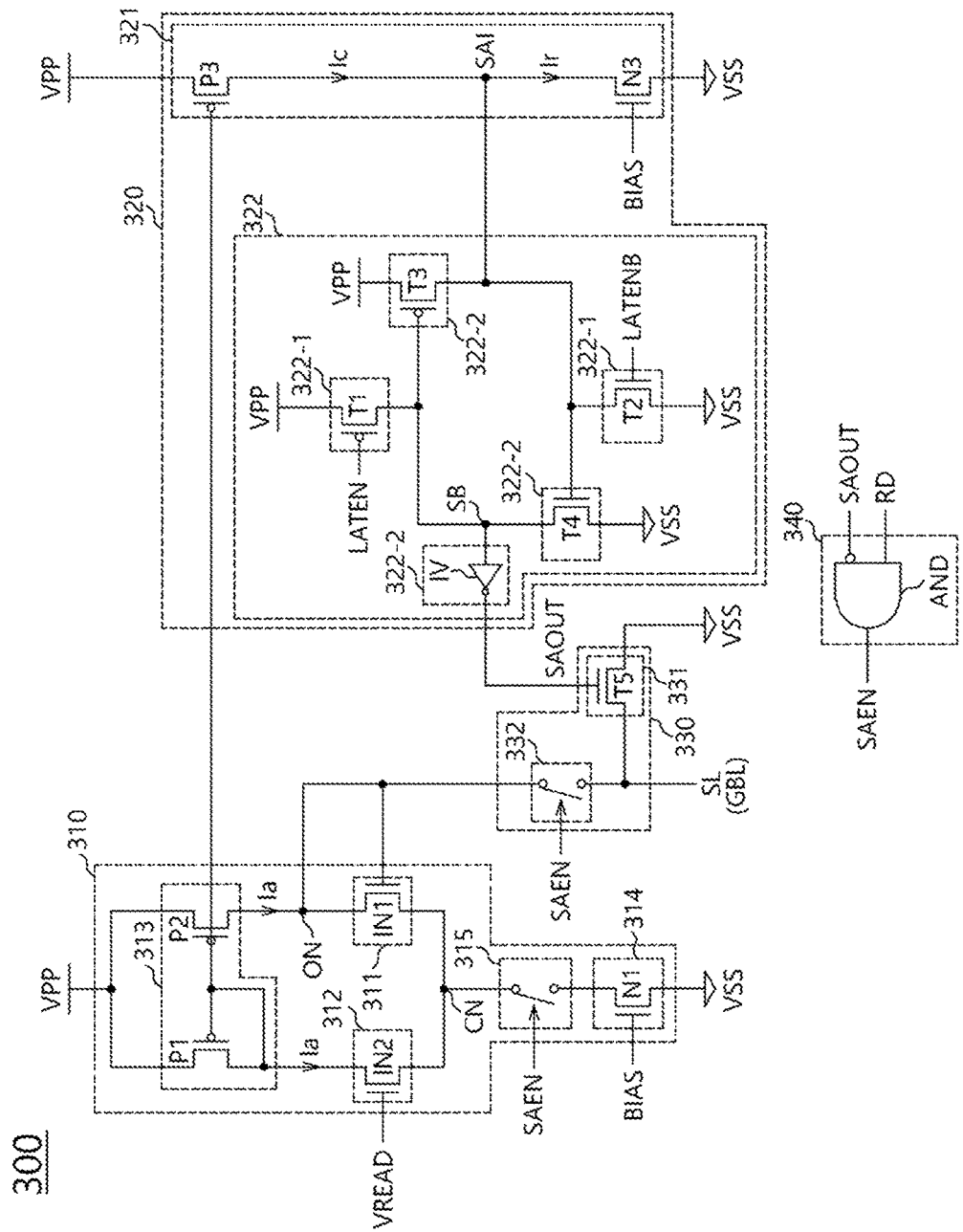
FIG. 3 is a diagram illustrating a sense amplifier in accordance with an embodiment.

FIG. 3 is a diagram illustrating a sense amplifier 300 in accordance with an embodiment. The sense amplifier 300 illustrated in FIG. 3 may correspond to the sense amplifier 150 described with reference to FIG. 1. Referring to FIG. 3, the sense amplifier 300 may include an amplification circuit 310, a sensing control circuit 320 and a cell current control circuit 330. The amplification circuit 310 may be coupled to a signal line SL, and may compare a voltage level of the signal line SL with a level of the read voltage VREAD and amplify voltage differences between the voltage level of the signal line SL and the level of the read voltage VREAD. The amplification circuit 310 may generate an amplified current Ia by amplifying the voltage difference between the voltage level of the signal line SL and the level of the read voltage VREAD. The signal line SL may correspond to the global bit line GBL described with reference to FIG. 1. Therefore, the amplification circuit 310 may be coupled to a memory cell through the signal line SL. The read voltage VREAD may correspond to the read voltage VREAD described with reference to FIG. 2. The amplification circuit 310 may compare the voltage level of the signal line SL with the level of the read voltage VREAD, and may change an amount of the amplified current Ia flowing through an output node ON. For example, the amplification circuit 310 may decrease the amount of the amplified current Ia when the voltage level of the signal line SL is higher than the level of the read voltage VREAD, and may increase the amount of the amplified current Ia when the voltage level of the signal line SL is lower than the level of the read voltage VREAD. The voltage level of the signal line SL may change according to a resistance state of a memory cell coupled to the signal line SL. For example, a current having a relatively smaller amount may flow out through the signal line SL and the voltage level of the signal line SL may increase when the memory cell is in a high resistance state. For example, a current having a relatively greater amount may flow out through the signal line SL and the voltage level of the signal line SL may decrease when the memory cell is in a low resistance state.

The amplification circuit 310 may include a first input unit 311, a second input unit 312 and a current mirror 313. The first input unit 311 may be coupled to the signal line SL. The first input unit 311 may be coupled between the output node ON and a common node CN. The second input unit 312 may receive the read voltage VREAD. The second input unit 312 may be coupled between the current mirror 313 and the common node CN. The current mirror 313 may receive a power supply voltage VPP, and may be coupled between the first and second input units 311 and 312. The current mirror 313 may be coupled to the first input unit 311 through the output node ON.

The first input unit 311 may include a first input transistor IN1. For example, the first input transistor IN1 may be an N channel MOS transistor. The first input transistor IN1 may be coupled to the output node ON and the common node CN at its drain and source, respectively, and may be coupled to the signal line SL at its gate. The first input transistor IN1 may precharge the signal line SL. The second input unit 312 may include a second input transistor IN2. For example, the second input transistor IN2 may be an N channel MOS transistor. The second input transistor IN2 may be coupled to the current mirror 313 and the common node CN at its drain and source, respectively, and may receive the read voltage VREAD through its gate. The current mirror 313 may include a first mirror transistor P1 and a second mirror transistor P2. For example, each of the first and second mirror transistors P1 and P2 may be a P channel MOS transistor. The first mirror transistor P1 may be coupled to the power supply voltage VPP and the output node ON at its source and drain, respectively. The second mirror transistor P2 may be coupled to the power supply voltage VPP and the drain of the second input transistor IN2 at its source and drain, respectively, and may be coupled to the gate of the first mirror transistor P1 and the drain of the second input transistor IN2 at its gate.

The amplification circuit 310 may further include a current control unit 314 and an enable switch 315. The current control unit 314 may control an amount of current flowing from the common node CN to a ground voltage VSS based on a bias voltage BIAS. An amount of current flowing through the current control unit 314 may be controlled according to a level of the bias voltage BIAS. The enable switch 315 may switch the common node CN and the current control unit 314 based on a sensing enable signal SAEN. For example, when the sensing enable signal SAEN is enabled, the enable switch 315 may form a current path of the amplification circuit 310 and may activate the amplification circuit 310 by coupling the current control unit 314 to the common node CN. For example, when the sensing enable signal SAEN is disabled, the enable switch 315 may deactivate the amplification circuit 310 by de-coupling the current control unit 314 and the common node CN. The current control unit 314 may include a sink transistor N1. For example, the sink transistor N1 may be an N channel MOS transistor. The sink transistor N1 may receive the bias voltage BIAS through its gate, may be coupled to the common node CN through the enable switch 315 at its drain, and may be coupled to the ground voltage VSS at its source.

The sensing control circuit 320 may generate an output signal SAOUT based on the amplified current Ia and a reference current Ir of the amplification circuit 310. The sensing control circuit 320 may generate a copied current Ic based on the amplified current Ia, and may generate the output signal SAOUT by comparing the copied current Ic and the reference current Ir. The sensing control circuit 320 may include a current comparison unit 321 and an output signal generation unit 322. The current comparison unit 321 may be coupled to the amplification circuit 310, and may generate the copied current Ic based on the amplified current Ia. The current comparison unit 321 may change a voltage level of a sensing node SAI by comparing the copied current Ic with the reference current Ir. The current comparison unit 321 may generate the reference current Ir based on the bias voltage BIAS. The output signal generation unit 322 may generate the output signal SAOUT based on the voltage level of the sensing node SAI.

The current comparison unit 321 may include a copy transistor P3 and a reference transistor N3. The copy transistor P3 may be of the same kind as the first and second mirror transistors P1 and P2 included in the current mirror 313, and the reference transistor N3 may be of the same kind as the sink transistor N1 included in the current control unit 314. For example, the copy transistor P3 may be a P channel MOS transistor and the reference transistor N3 may be an N channel MOS transistor. The copy transistor P3 may be coupled to the power supply voltage VPP and the sensing node SAI at its source and drain, respectively, and may be coupled to the gates of the first and second mirror transistors P1 and P2 at its gate. Therefore, a current may flow through the copy transistor P3, the current having an amount corresponding to an amount of a current flowing through the first and second mirror transistors P1 and P2. The current comparison unit 321 may generate the copied current Ic by copying the amplified current Ia by a predetermined ratio. For example, an amount of the copied current Ic may be smaller than an amount of the amplified current Ia. The first and second mirror transistors P1 and P2 may have the same size as each other and the copy transistor P3 may have a size proportional to size of the first and second mirror transistors P1 and P2. For example, the size of the copy transistor P3 may be smaller than each size of the first and second mirror transistors P1 and P2. For example, a size ratio of the copy transistor P3 to each of the first and second mirror transistors P1 and P2 may be 1:2, which the scope of the present disclosure will not be limited thereto.

The reference transistor N3 may be coupled to the sensing node SAI and the ground voltage VSS at its drain and source, respectively, and may receive the bias voltage BIAS through its gate. The reference transistor N3 may control an amount of the reference current Ir based on the bias voltage BIAS. Therefore, a current may flow through the reference transistor N3, the current having an amount corresponding to an amount of a current flowing through the current control unit 314. The current comparison unit 321 may generate the reference current Ir having an amount proportional by a predetermined ratio to the current flowing through the current control unit 314. For example, the current comparison unit 321 may generate the reference current Ir having a smaller amount than the current flowing through the current control unit 314. The reference transistor N3 may have a size proportional to a size of the sink transistor N1. For example, the reference transistor N3 may have a smaller size than the sink transistor N1. The amount of the reference current Ir may be determined according to the size ratio of the reference transistor N3 to the sink transistor N1. For example, the size ratio of the reference transistor N3 to sink transistor N1 may be 3:8, which the scope of the present disclosure will not be limited thereto.

It is assumed that an amount of total current flowing through the current control unit 314 is "A". When the size ratio of the reference transistor N3 to the sink transistor N1 is 3:8 and the size ratio of the copy transistor P3 to each of the first and second mirror transistors P1 and P2 is 1:2, the amount of the reference current Ir may be "3A/8". The amount of the amplified current Ia may be "A" when the voltage level of the signal line SL is lower than the level of the read voltage VREAD. Therefore, the amount of the copied current Ic may be "A/2". Since the copied current Ic has a greater amount than the reference current Ir, the voltage level of the sensing node SAI may increase. On the other hand, the amount of the amplified current Ia may be "A/2" when the voltage level of the signal line SL is higher than the level of the read voltage VREAD. Therefore, the amount of the copied current Ic may be "A/4". Since the copied current Ic has a smaller amount than the reference current Ir, the voltage level of the sensing node SAI may decrease. Therefore, the current comparison unit 321 may operate together with the amplification circuit 310, and may change the voltage level of the sensing node SAI according to the voltage level of the signal line SL.

The output signal generation unit 322 may include a reset unit 322-1 and a latch unit 322-2. The reset unit 322-1 may reset the output signal SAOUT based on a latch enable signal LATEN. The reset unit 322-1 may reset the output signal SAOUT to have a low level when the latch enable signal LATEN is disabled. The reset unit 322-1 may release the output signal SAOUT from the reset state and may allow the output signal SAOUT to have a voltage level changing according to the voltage level of the sensing node SAI when the latch enable signal LATEN is enabled. The latch unit 322-2 may change the voltage level of the output signal SAOUT according to the voltage level of the sensing node SAI.

The reset unit 322-1 may include a first transistor T1 and a second transistor T2. The first transistor T1 may be a P channel MOS transistor, and the second transistor T2 may be an N channel MOS transistor. The first transistor T1 may receive the latch enable signal LATEN through its gate, may receive the power supply voltage VPP at its source, and may be coupled to a node SB at its drain. The second transistor T2 may receive an inversed signal LATENB of the latch enable signal LATEN at its gate, may be coupled to the sensing node SAI at its drain, and may be coupled to the ground voltage VSS at its source. Therefore, when the latch enable signal LATEN is disabled, the first transistor T1 may be turned on and may drive the node SB through the power supply voltage VPP and the second transistor T2 may be turned on and may drive the sensing node SAI through the ground voltage VSS.

The latch unit 322-2 may include a third transistor T3, a fourth transistor T4 and an inverter IV. The third transistor T3 may be a P channel MOS transistor, and the fourth transistor T4 may be an N channel MOS transistor. The third transistor T3 may be coupled to the node SB at its gate, may receive the power supply voltage VPP through its source, and may be coupled to the sensing node SAI at its drain. The fourth transistor T4 may be coupled to the sensing node SAI at its gate, may be coupled to the node SB at its drain, and may be coupled to the ground voltage VSS at its source. The inverter IV may output the output signal SAOUT by inverting the voltage level of the node SB. When the latch enable signal LATEN is enabled, the first and second transistors T1 and T2 may be turned off. When the voltage level of the sensing node SAI is a high level, the fourth transistor T4 may be turned on and the voltage level of the node SB may become the level of the ground voltage VSS. Therefore, since the output signal SAOUT having a high level is output through the inverter IV and the voltage level of the sensing node SAI is maintained to a high level according to the voltage level of the node SB, the output signal SAOUT may also be kept to have a high level. When the voltage level of the sensing node SAI is a low level, the fourth transistor T4 may be turned off.

The cell current control circuit 330 may decrease the voltage level of the signal line SL based on the output signal SAOUT. The cell current control circuit 330 may include a discharge unit 331. The discharge unit 331 may decrease the voltage level of the signal line SL based on the output signal SAOUT. The discharge unit 331 may include a fifth transistor T5. The fifth transistor T5 may be an N channel MOS transistor. The fifth transistor T5 may receive the output signal SAOUT through its gate, and may be coupled to the ground voltage VSS and the signal line SL at its drain and source, respectively. When the output signal SAOUT has a high level, the fifth transistor T5 may decrease the voltage level of the signal line SL by coupling the signal line SL to the ground voltage VSS.

The cell current control circuit 330 may decouple the amplification circuit 310 and the signal line SL based on the output signal SAOUT. The sense amplifier 300 may further include a sensing enable signal generation unit 340. The sensing enable signal generation unit 340 may generate the sensing enable signal SAEN based on a read signal RD and the output signal SAOUT. The read signal RD may be enabled in order to read data stored in or a resistance state of a memory cell coupled to the signal line SL during a read operation, and may be generated on the basis of a read command provided from an external device. The cell current control circuit 330 may further include a current cut-off switch 332. The current cut-off switch 332 may couple the amplification circuit 310 to the signal line SL based on the sensing enable signal SAEN. The current cut-off switch 332 may be coupled to the output node ON of the amplification circuit 310 at one end thereof, and may be coupled to the signal line SL at the other end thereof. For example, the current cut-off switch 332 may couple the amplification circuit 310 to the signal line SL when the sensing enable signal SAEN is enabled. For example, the current cut-off switch 332 may decouple the amplification circuit 310 and the signal line SL when the sensing enable signal SAEN is disabled. The sensing enable signal generation unit 340 may include a logic gate to perform a logic operation, for example but not limited to, an AND gate AND. The AND gate AND may generate the sensing enable signal SAEN by receiving the read signal RD and an inverted signal of the output signal SAOUT. The sensing enable signal generation unit 340 may enable the sensing enable signal SAEN to a high level when the output signal SAOUT a low level and the read signal RD is enabled to a high level. The sensing enable signal generation unit 340 may disable the sensing enable signal SAEN to a low level when the output signal SAOUT is changed to a high level.

Figure 4:
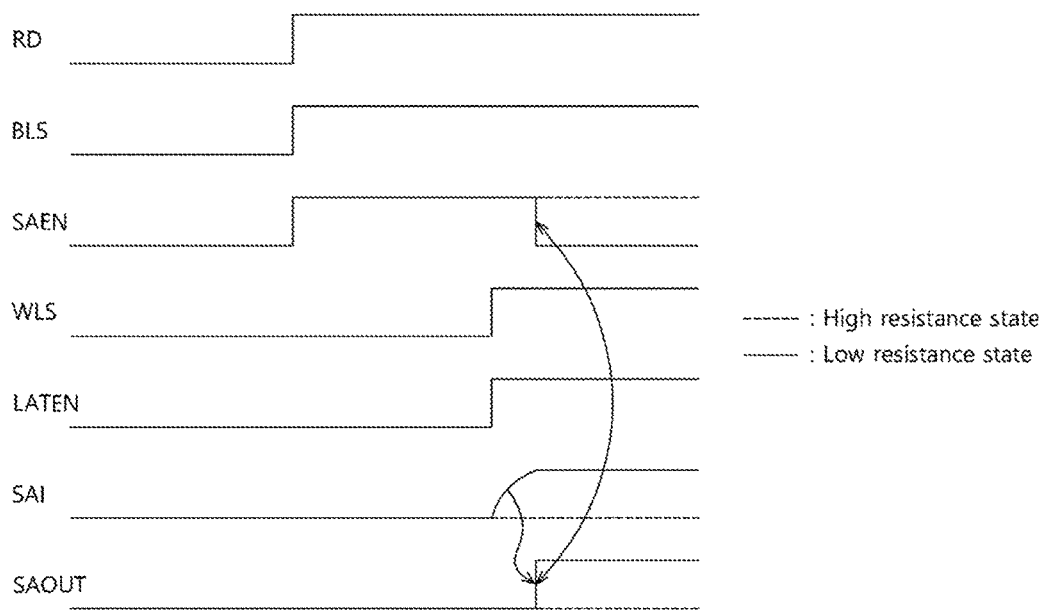
FIG. 4 is a timing diagram illustrating operations of a sense amplifier and a non-volatile memory apparatus in accordance with an embodiment.

FIG. 4 is a timing diagram illustrating operations of the sense amplifier 300 and the nonvolatile memory apparatus 1 in accordance with an embodiment. Described with reference to FIGS. 1 to 4 will be a read operation of the sense amplifier 300 and the nonvolatile memory apparatus 1 in accordance with an embodiment. When the read operation is not performed, the read signal RD and the latch enable signal LATEN may be disabled to a low level. Therefore, the sensing enable signal SAEN may be in a disabled state, and the output signal SAOUT may be reset to a low level by the reset unit 322-1.

When the read operation starts to be performed to the non-volatile memory apparatus 1, the read signal RD may be enabled and a bit line selection signal BLS may be enabled. When the read signal RD is enabled, the sensing enable signal SAEN may be enabled and the sensing enable switch 315 may activate the amplification circuit 310 by forming a current path. Further, the current cut-off switch 332 may couple the amplification circuit 310 to the signal line SL and the signal line SL may be coupled to a bit line BL coupled to a particular memory cell through the column switch 120. Since the signal line SL is coupled to the gate and drain of the first input transistor IN1, which is included in the first input unit 311 of the amplification circuit 310, the signal line SL may be precharged to a voltage level corresponding to the read voltage VREAD by the amplification circuit 310. Then, the word line selection signal WLS may be enabled and the latch enable signal LATEN may be enabled. When the word line selection signal WLS is enabled, the particular memory cell may be coupled to the global word line GWL through the row switch 130 and a current may flow through the particular memory cell.

A relatively smaller amount of current may flow through the particular memory cell when the particular memory cell is in a high resistance state, and a relatively greater amount of current may flow through the particular memory cell when the particular memory cell is in a low resistance state. A current having a relatively smaller amount may flow out through the signal line SL and the voltage level of the signal line SL may increase to a level relatively higher than the level of the read voltage VREAD when the memory cell is in a high resistance state. The amount of the amplified current Ia flowing through the output node ON may be small, and the amount of the copied current Ic may be smaller than the amount of the reference current Ir. Therefore, the sensing node SAI may have a relatively low voltage level. When the voltage level of the sensing node SAI is low, the latch unit 322-2 may be turned off and thus the output signal SAOUT may be kept to have a low voltage level and the sensing enable signal SAEN may be kept to be enabled.

When the particular memory cell is in a low resistance state, the particular memory cell may be turned on as illustrated in FIG. 2, and a current having a great amount may flow irregularly through the particular memory cell. A current having a relatively greater amount may flow out through the signal line SL and the voltage level of the signal line SL may decrease to a level relatively lower than the level of the read voltage VREAD when the memory cell is in a low resistance state. Therefore, the amount of the amplified current Ia flowing through the output node ON may be great, and the amount of the copied current Ic may be greater than the amount of the reference current Ir. Therefore, the sensing node SAI may have a relatively high voltage level. When the voltage level of the sensing node SAI is high, the third and fourth transistors T3 and T4 of the latch unit 322-2 may be turned on and the output signal SAOUT having a high level may be generated through the inverter IV. The discharge unit 331 may discharge the signal line SL to the ground voltage VSS based on the output signal SAOUT. Further, when the output signal SAOUT having a high level is generated, the sensing enable signal generation unit 340 may disabled the sensing enable signal SAEN. The current cut-off switch 332 may decouple the amplification circuit 310 and the signal line SL. Once the particular memory cell is sensed to be in a low resistance state and the level of the output signal SAOUT is changed, the discharge unit 331 may discharge the signal line SL and the current cut-off switch 332 may decouple the amplification circuit 310 and the signal line SL. Therefore, a current may be blocked from flowing into the signal line SL and the voltage level of the signal line SL may decrease. Accordingly, a current flowing through the particular memory cell may be effectively reduced, and a current having an excessive amount may be prevented from flowing through the particular memory cell, thereby maintaining durability of the particular memory cell.

Figure 5:
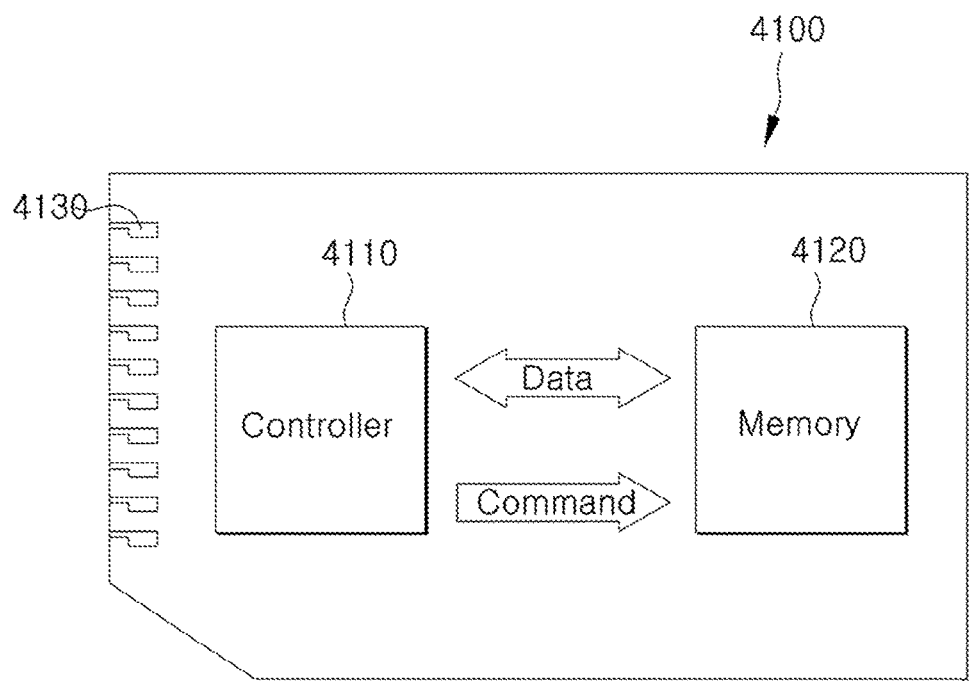
FIG. 5 is a diagram illustrating a memory card system including a sense amplifier and a non-volatile memory apparatus in accordance with an embodiment.

FIG. 5 is a schematic diagram illustrating a memory card system 4100 including the sense amplifier 300 and the nonvolatile memory apparatus 1 in accordance with various embodiments. Referring to FIG. 5, the memory card system 4100 may include a controller 4110, a memory 4120 and an interface member 4130. The controller 4110 and the memory 4120 may be configured to exchange a command and/or data. For example, the memory 4120 may be used to store a command, which is executed by the controller 4110, and/or user data.

The memory card system 4100 may store data into the memory 4120 or output data to an external from the memory 4120. The memory 4120 may include the non-volatile memory apparatus 1 in accordance with various embodiments.

The interface member 4130 may configured to transfer data from/to an external. The memory card system 4100 may be a multimedia card (MMC), a secure digital card (SD) or a portable data storage device.

Figure 6:
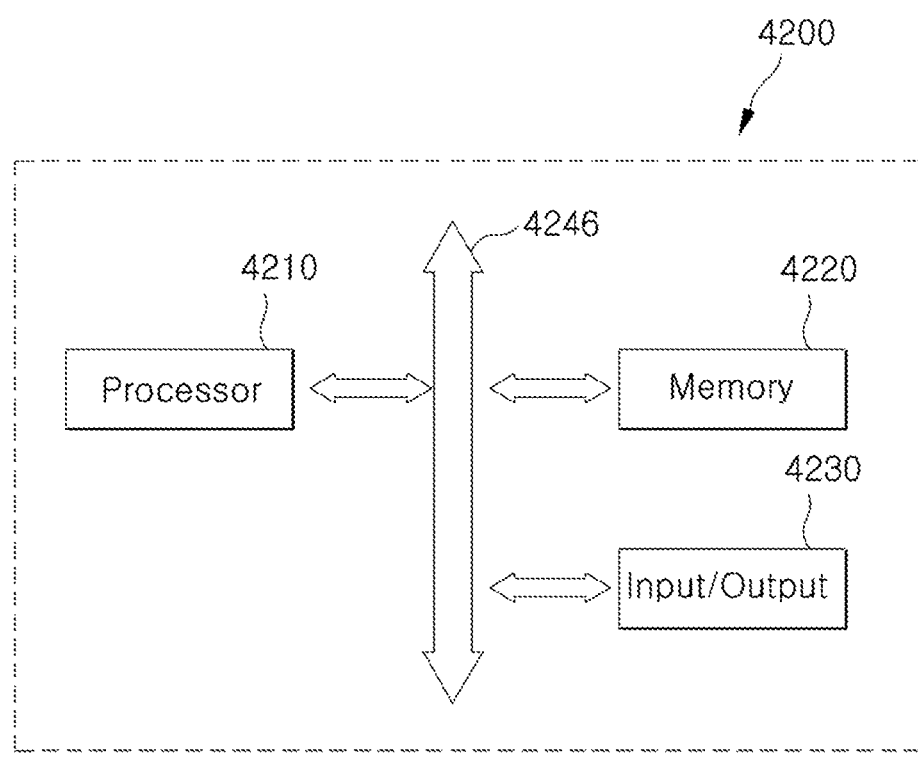
FIG. 6 is a block diagram illustrating an electronic device including a sense amplifier and a non-volatile memory apparatus in accordance with various embodiments.

FIG. 6 is a block diagram illustrating an electronic device 4200 including the sense amplifier 300 and the non-volatile memory apparatus 1 in accordance with various embodiments. Referring to FIG. 6, the electronic device 4200 may include a processor 4210, a memory 4220 and an input and output (input/output) device 4230. The processor 4210, the memory 4220 and the input/output device 4230 may be coupled to one another through a bus 4246.

The memory 4220 may receive a control signal from the processor 4210. The memory 4220 may be used to store code and data for the operation of the processor 4210. The memory 4220 may be used to store data, which is accessed through the bus 4246. The memory 4220 may include the non-volatile memory apparatus 1 in accordance with various examples of embodiments of the present disclosure. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state disk (SSD), a household appliance, or any device capable of wireless communication.

Figure 7:
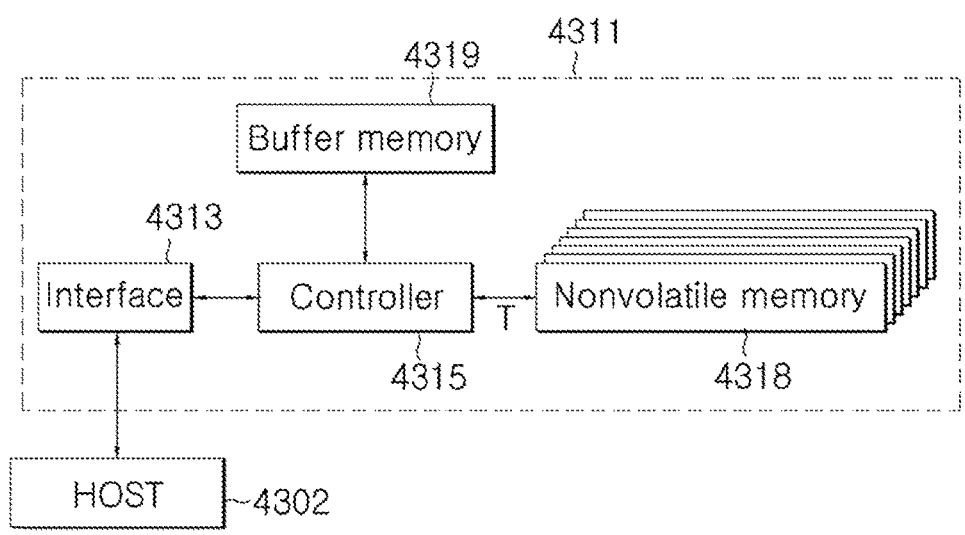
FIG. 7 is a block diagram illustrating a data storage device including a sense amplifier and a non-volatile memory apparatus in accordance with various embodiments.
Figure 8:
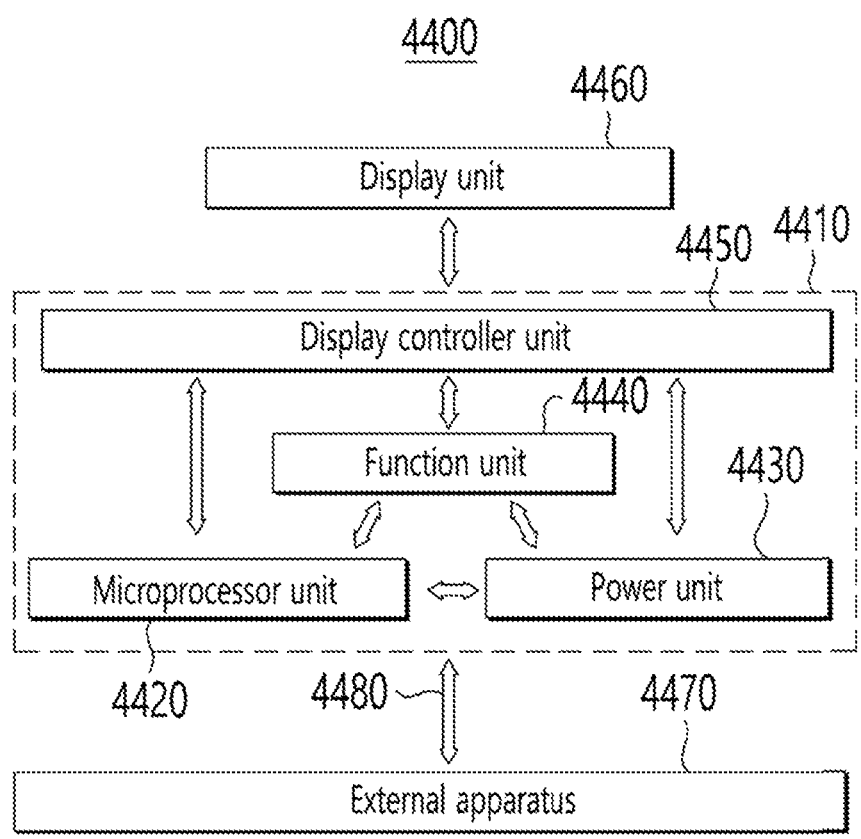
FIG. 8 is a block diagram illustrating an electronic system including a sense amplifier and a non-volatile memory apparatus in accordance with various embodiments.

Describe with reference to FIGS. 7 and 8 will be examples of the implementations and modifications of the electronic device 4200.

FIG. 7 is a block diagram illustrating a data storage device including the sense amplifier 300 and the non-volatile memory apparatus 1 in accordance with various embodiments. Referring to FIG. 7, a data storage device may be provided such as the solid state disk (SSD: 4311). The SSD 4311 may include an interface 4313, a controller 4315, a nonvolatile memory 4318, and a buffer memory 4319.

The SSD 4311 stores data through a semiconductor apparatus. The SSD 4311 has an advantage over the hard disk drive (HDD) since the SSD 4311 operates faster and is friendly to miniaturization and weight-lightening while having low mechanical delay or failure rate, low heating and low noise. The SSD 4311 may be widely used in a notebook PC, a netbook, a desktop PC, a MP3 player, or a portable storage device.

The controller 4315 may be disposed near to the interface 4313 and may be electrically coupled to the interface 4313. The controller 4315 may be a microprocessor including a memory controller and a buffer controller. The non-volatile memory 4318 may be disposed near to the controller 4315 and may be electrically coupled to the controller 4315 through a connection terminal T. Data storage capacity of the SSD 4311 may correspond to that of the non-volatile memory 4318. The buffer memory 4319 may be disposed near to the controller 4315 and may be electrically coupled to the controller 4315.

The interface 4313 may be coupled to a host 4302 and configured to transfer an electrical signal such as data. For example, the interface 4313 may conform to a protocol such as SATA, IDE, SCSI, and/or combination thereof. The non-volatile memory 4318 may be coupled to the interface 4313 through the controller 4315.

The non-volatile memory 4318 may store data provided through the interface 4313. The non-volatile memory 4318 may include the non-volatile memory apparatus 1 in accordance with various exemplary embodiments of the present disclosure. The non-volatile memory 4318 may maintain stored data even when power supply to the SSD 4311 is cut off.

The buffer memory 4319 may include a volatile memory. The volatile memory may be DRAM and/or SRAM. The buffer memory 4319 may operate faster than the non-volatile memory 4318.

The interface 4313 may process data faster than the non-volatile memory 4318. The buffer memory 4319 may temporarily store data. Data provided through the interface 4313 may be temporarily stored in the buffer memory 4319 via the controller 4315, and may be stored in the non-volatile memory 4318 at the data storage speed of the non-volatile memory 4318.

Among data stored in the non-volatile memory 4318, frequently accessed data may be read in advance from the non-volatile memory 4318 and temporarily stored in the buffer memory 4319. That is, the buffer memory 4319 may serve to increase effective operation speed of the SSD 4311 and reduce error rate of the SSD 4311.

FIG. 8 is a block diagram illustrating an electronic system 4400 including the sense amplifier 300 and the non-volatile memory apparatus 1 in accordance with various embodiments. Referring to FIG. 8, the electronic system 4400 may include a body 4410, a microprocessor unit 4420, a power unit 4430, a function unit 4440, and a display controller unit 4450.

The body 4410 may be a motherboard formed with the printed circuit board (PCB). The microprocessor unit 4420, the power unit 4430, the function unit 4440, and the display controller unit 4450 may be mounted on the body 4410. A display unit 4460 may be disposed in or outside the body 4410. For example, the display unit 4460 may be disposed on a surface of the body 4410 and display image processed by the display controller unit 4450.

The power unit 4430 may receive a predetermined voltage from an external battery, divide the provided voltage into required voltages of various levels, and provide the divided voltages to the microprocessor unit 4420, the function unit 4440, the display controller unit 4450 and so forth. The microprocessor unit 4420 may receive the divided voltage from the power unit 4430 and may control the function unit 4440 and the display unit 4460. The function unit 4440 may perform various functions of the electronic system 4400. For example, if the electronic system 4400 is a cellular phone, the function unit 4440 may include various element capable of cellular phone functions such as dialing, image output to the display unit 4460 and voice output to a speaker through communication with an external device 4470 and so forth, and may function as a camera image processor when a camera is mounted in the electronic system 4400.

If the electronic system 4400 is coupled to a memory card for storage capacity expansion, the function unit 4440 may be a memory card controller. The function unit 4440 may exchange signals with the external device 4470 through a wired or wireless communication unit 4480. If the electronic system 4400 requires a device such as a universal serial bus (USB) storage device for function expansion, the function unit 4440 may work as an interface controller. The non-volatile memory apparatus 1 in accordance with various examples of embodiments of the present disclosure may be applied to one or more of the microprocessor unit 4420 and the function unit 4440.

While certain embodiments have been described above, it will be understood to those skilled in the art that the embodiments described are by way of example only. Accordingly, the sense amplifier, non-volatile memory apparatus and system including the same should not be limited based on the described embodiments. Rather, the sense amplifier, non-volatile memory apparatus and system including the same described herein should only be limited in light of the claims that follow when taken in conjunction with the above description and accompanying drawings.

What is claimed is:

1. A sense amplifier comprising:
   an amplification circuit configured to compare and amplify a voltage level of a signal line and a level of a read voltage to generate an amplified current;
   a sensing control circuit configured to generate an output signal based on a reference current and the amplified current; and
   a cell current control circuit configured to decrease the voltage level of the signal line based on the output signal.

2. The sense amplifier of claim 1,
   wherein the amplification circuit includes a first input unit, a second input unit and an output node, the first input unit is coupled to the signal line and the output node, and the second input unit receives the read voltage, and
   wherein the amplification circuit includes:
   a current mirror configured to provide the amplified current to the output node;
   a current control unit configured to control a current flowing from a common node, which is commonly coupled to the first and second input units, to a ground voltage based on a bias voltage; and
   an enable switch configured to enable the amplification circuit based on a sensing enable signal.

3. The sense amplifier of claim 1, wherein the sensing control circuit includes:
   a current comparison unit configured to generate a copied current based on the amplified current of the amplification circuit, and change a voltage level of a sensing node by comparing the copied current with the reference current; and
   an output signal generation unit configured to generate the output signal based on a latch enable signal and the voltage level of the sensing node.

4. The sense amplifier of claim 3, wherein the current comparison unit generates the copied current by copying the amplified current by a predetermined ratio.

5. The sense amplifier of claim 3, wherein the current comparison unit generates the reference current based on a bias voltage.

6. The sense amplifier of claim 3, wherein the output signal generation unit includes:
   a reset unit configured to reset the output signal based on the latch enable signal; and a latch unit configured to change the voltage level of the output signal based on the voltage level of the sensing node.

7. The sense amplifier of claim 1, wherein the cell current control circuit includes a discharge unit configured to decrease the voltage level of the signal line based on the output signal.

8. The sense amplifier of claim 7, further comprising a sensing enable signal generation unit configured to generate a sensing enable signal based on a read signal and the output signal.

9. The sense amplifier of claim 8, wherein the cell current control circuit further includes a current switch configured to block connection between the amplification circuit and the signal line based on the sensing enable signal.

10. A sense amplifier comprising:
an amplification circuit configured to provide an amplified current to an output node according to a voltage level of a signal line and a read voltage;
a current comparison unit configured to change the voltage level of a sensing node based on the amplified current and a reference current;
an output signal generation unit configured to generate an output signal based on the voltage level of the sensing node; and
a cell current control circuit configured to decrease the voltage level of the signal line based on the output signal.

11. The sense amplifier of claim 10,
wherein the amplification circuit includes:
a first input unit coupled to the signal line;
a second input unit configured to receive the read voltage; and
a current mirror configured to provide the amplified current to an output node coupled to the first input unit, and
wherein the current mirror includes:
a first mirror transistor has a drain and a source coupled between a power supply voltage and the output node; and
a second mirror transistor has a source and a drain coupled between the power supply voltage and the second input unit, and a gate coupled to a gate of the first mirror transistor and the second input unit.

12. The sense amplifier of claim 11,
wherein the current comparison unit includes a copy transistor, and
wherein the copy transistor has a drain and a source coupled between the power supply voltage and the sensing node, and a gate coupled to the gates of the first and second mirror transistors.

13. The sense amplifier of claim 12, wherein the copy transistor has a size proportional to each size of the first and second mirror transistors.

14. The sense amplifier of claim 11,
wherein the amplification circuit further includes a current control unit configured to control a current flowing from a common node, which is commonly coupled to the first and second input units, to a ground voltage based on a bias voltage, and
wherein the current control unit includes a sink transistor having a drain and a source coupled between the common node and the ground voltage, respectively, and a gate receiving the bias voltage.

15. The sense amplifier of claim 14,
wherein the current comparison unit includes a reference transistor, and
wherein the reference transistor has a drain and a source coupled between the sensing node and the ground voltage, and a gate receiving the bias voltage.

16. The sense amplifier of claim 15, wherein the reference transistor has a size proportional to a size of the sink transistor.

17. The sense amplifier of claim 10, wherein the output signal generation unit includes:
a reset unit configured to reset the output signal based on a latch enable signal; and
a latch unit configured to change the voltage level of the output signal based on the voltage level of the sensing node.

18. The sense amplifier of claim 10, wherein the cell current control circuit includes a discharge unit configured to decrease the voltage level of the signal line based on the output signal.

19. The sense amplifier of claim 18, further comprising a sensing enable signal generation unit configured to generate a sensing enable signal based on a read signal and the output signal.

20. The sense amplifier of claim 19, wherein the cell current control circuit further includes a current switch configured to block connection between the amplification circuit and the signal line based on the sensing enable signal.

* * * * *